(12) United States Patent
Huang et al.

(10) Patent No.: US 7,405,445 B2
(45) Date of Patent: Jul. 29, 2008

(54) SEMICONDUCTOR STRUCTURE AND METHOD FOR ESD PROTECTION

(75) Inventors: Shao-Chang Huang, Hsin-Chu (TW); Jian-Hsing Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 343 days.

(21) Appl. No.: 10/887,793

(22) Filed: Jul. 9, 2004

(65) Prior Publication Data

US 2005/0280091 A1 Dec. 22, 2005

Related U.S. Application Data

(60) Provisional application No. 60/580,970, filed on Jun. 18, 2004.

(51) Int. Cl.
*H01L 23/62* (2006.01)
(52) U.S. Cl. ............... 257/355; 257/361; 257/362; 257/E27.051; 257/E29.013
(58) Field of Classification Search .............. 257/355, 257/357–362
See application file for complete search history.

(56) References Cited

U.S. PATENT DOCUMENTS

| | | | |
|---|---|---|---|
| 3,573,550 A | 4/1971 | Baker et al. | |
| 5,530,612 A | 6/1996 | Maloney | |
| 5,907,464 A | 5/1999 | Maloney et al. | |
| 5,945,713 A | 8/1999 | Voldman | |
| 5,959,820 A | 9/1999 | Ker et al. | |
| 5,986,863 A | 11/1999 | Oh | |
| 6,144,542 A | 11/2000 | Ker et al. | |
| 6,259,139 B1 | 7/2001 | Pan | |
| 6,274,909 B1 | 8/2001 | Chang et al. | |
| 6,306,695 B1 | 10/2001 | Lee et al. | |
| 6,448,123 B1 | 9/2002 | Lee et al. | |
| 6,541,824 B2 | 4/2003 | Lee et al. | |
| 6,576,958 B2 | 6/2003 | Ker et al. | |
| 6,661,060 B2 | 12/2003 | Lee et al. | |
| 6,661,273 B1 | 12/2003 | Lai et al. | |
| 6,690,066 B1 | 2/2004 | Lin et al. | |
| 6,858,902 B1* | 2/2005 | Salling et al. ............... 257/360 |
| 7,145,204 B2* | 12/2006 | Duvvury et al. ............. 257/355 |
| 2001/0036050 A1* | 11/2001 | Lee et al. ...................... 361/56 |
| 2002/0163768 A1* | 11/2002 | Kwon et al. ................... 361/56 |
| 2004/0155291 A1* | 8/2004 | Okushima ................... 257/355 |
| 2004/0212936 A1* | 10/2004 | Salling et al. ................. 361/56 |
| 2005/0045909 A1* | 3/2005 | Zhang ........................ 257/173 |
| 2006/0044719 A1* | 3/2006 | Chen et al. .................... 361/56 |
| 2006/0238937 A1* | 10/2006 | Esmark et al. ................ 361/56 |

FOREIGN PATENT DOCUMENTS

JP 2003-31673 * 1/2003

OTHER PUBLICATIONS

Dabral et al.,"Core Clamps for Low Voltage Technologies" EOS/ESD Symposium 1994.*
Ker, M.-D., et al., "Design on the Low-Leakage Diode String for Using in the Power-Rail ESD Clamp Circuits in a 0.35-μm Silicide CMOS Process," IEEE Transactions On Solid-State Circuits, vol. 35, No. 4, Apr. 2000, pp. 601-611.
Maloney, T.J., et al., "Novel Clamp Circuits For IC Power Supply Protection," EOS/ESD Symposium 95, pp. 1-12.

* cited by examiner

*Primary Examiner*—Ahmed Sefer
(74) *Attorney, Agent, or Firm*—Slater & Matsil, L.L.P.

(57) ABSTRACT

A semiconductor integrated circuit structure includes a plurality of diodes disposed in the substrate. These diodes are electrically coupled in series. At least one insertion region is disposed in the substrate between two of the diodes and a supply voltage node electrically coupled to the insertion region. Preferably, a guard ring surrounds the diodes.

14 Claims, 12 Drawing Sheets

US 7,405,445 B2

SEMICONDUCTOR STRUCTURE AND METHOD FOR ESD PROTECTION

This application claims the benefit of U.S. Provisional Application No. 60/580,970, filed on Jun. 18, 2004, entitled Semiconductor Structure and Method for ESD Protection, which application is hereby incorporated herein by reference.

TECHNICAL FIELD

This invention relates generally to semiconductor devices and more particularly to the protection of semiconductor integrated circuits from static electricity.

BACKGROUND

It is well known that extremely high voltages can develop in the vicinity of an integrated circuit due to the build-up of static charge. A high potential may be generated to an input or output buffer of the integrated circuit, which may occur by a person simply touching a package pin that is in electrical contact with an input or output buffer of the integrated circuit. Upon electrostatic discharge, a high current is produced at the package nodes of the integrated circuit. Due to the potential of destroying the entire integrated circuit, ElectroStatic Discharge (ESD) is a serious problem for semiconductor devices.

One difficulty in designing ESD protection circuits is based on the demanding performance requirements that must be met. The characteristics of most semiconductor devices are such that they can be damaged even when subjected to very short duration transient voltages. Therefore, over voltage protection devices such as fuses and circuit breakers that operate on a thermal principal ordinarily respond much too slowly and usually cannot be relied upon to adequately protect semiconductor devices.

For this reason, it is rapidly becoming a known practice to incorporate an ESD protection system in the circuitry itself. Traditionally, a diode string is used. FIG. 1 is a schematic of a typical diode string 110 that includes four diodes $114_1$-$114_4$ (any one of which can be referred to as diode 114) formed in a silicon substrate (shown in FIG. 2). The circuit 100 also includes a reverse diode 112. Each diode 114 has a voltage called the threshold voltage or turn on voltage. When a voltage applied in the forward direction exceeds the turn on voltage of a diode, the diode changes to an "on" or conducting state. In the case of ESD protection, static charges are discharged through the diode string 110, and the voltage that can be applied on any one diode 114 is limited even though the current may be high. The diode string 110 also has a turn on voltage at which all diodes 114 change to a conducting state and the diode string 110 starts conducting. When the diode string 110 is turned on, static charges are discharged through the diode string, and the voltage between $V_{dd}$ and $V_{ss}$ is brought down. During a positive voltage transient, the diode string 110 turns on and sinks ESD current, and during a negative voltage transient, the reverse diode 112 turns on and sinks the ESD current.

SUMMARY OF THE INVENTION

In one aspect, the present invention provides an electrostatic discharge protection circuit, which is particularly designed to have an improved turn on voltage. In another aspect, the present invention provides an electrostatic discharge protection circuit that has a more predictable turn on voltage. In one preferred embodiment, which uses a p-substrate, a series of n-wells are formed in the p-substrate. A p+ region and an n+ region are formed in each n-well for forming a number of diodes. A p+ guard ring is formed around the diodes, which are coupled in series to form a diode string. P+ insertions are formed between the diodes. The guard ring and insertions are connected to power potentials or ground potentials. The guard ring and insertions provide effective sink to the leak current, so the leak current from one diode does not go through other diodes. The present invention can also be implemented in an n-substrate.

In one application, the concept of the present invention can be used to protect the circuit from voltage transients that occur at power sources or I/Os. It may also be used for power separation. The whole chip ESD design can use the present invention to provide effective protection of the circuit from damage caused by the ESD between any two nodes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
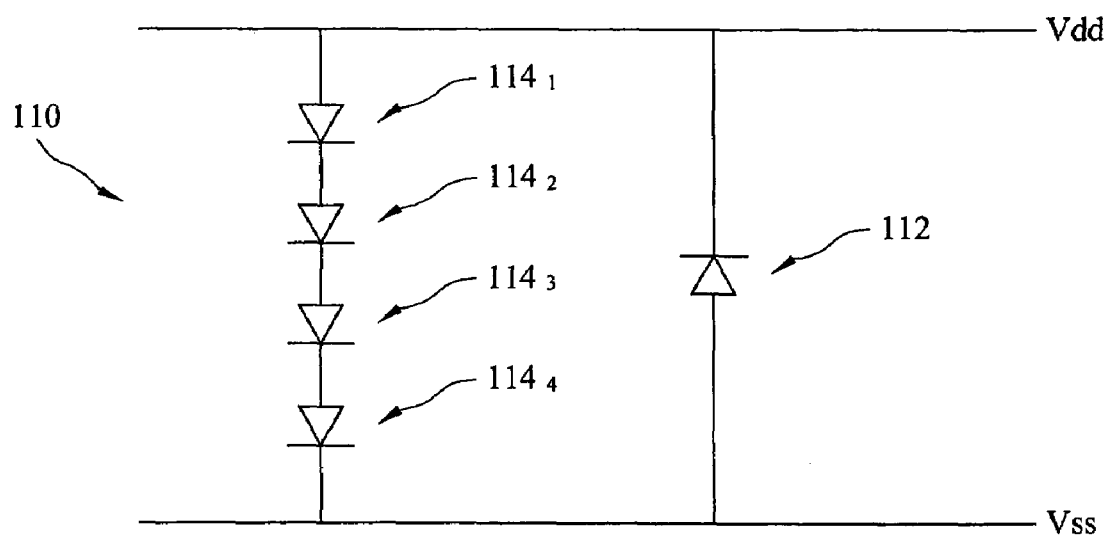
FIG. 1 is a schematic view of typical diode strings.

The present invention will now be described with reference to particular embodiments. First, a description of problems related to current diode strings (as described in FIG. 1) will be discussed. Various aspects of the present invention will then be discussed.

Figure 2:
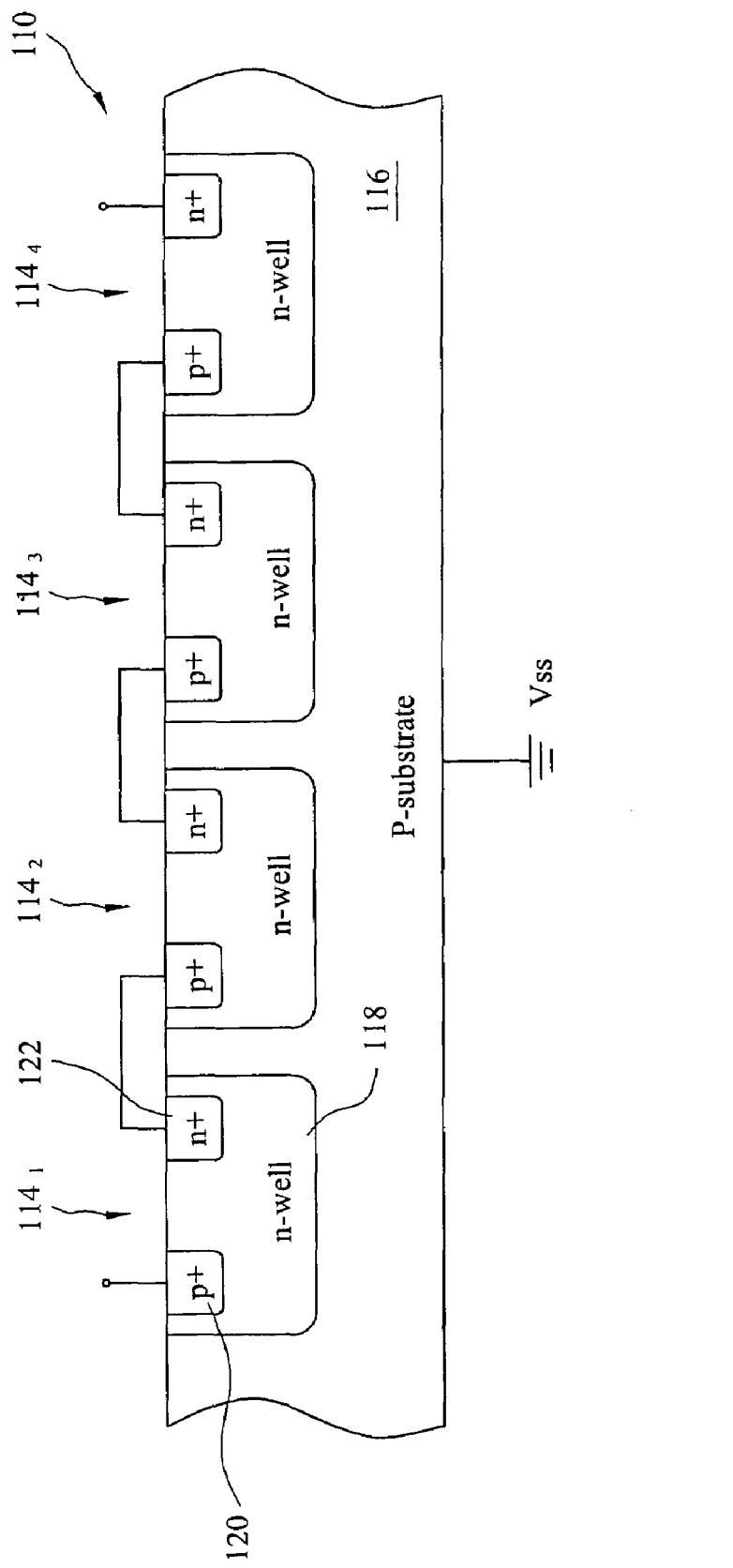
FIG. 2 is a cross-sectional view of a diode string.

FIG. 2 shows a cross-sectional view of a typical diode string 110 in a p-substrate 116. Using CMOS technology, n-wells 118 are formed in the substrate 116. A p+ region 120 is formed in the n-well so that a diode 114 is formed between the p+ region 120 and the n-well 118. An n+ region 122 is formed in an n-well 118 to improve contact between the resulting diode 114 and metal for the contact (not shown). As shown, the p-substrate 116 is coupled to $V_{ss}$, which may be a ground. Transistors are formed as by products of the process of forming the diodes. In particular, a pnp transistor, also called vertical bipolar transistor, is formed between the p+ region 120 (emitter), the n-well 118 (base) and the p-substrate 116 (collector). Since the p-substrate 116 is connected to $V_{ss}$, collector current leaks through the substrate of the vertical bipolar transistor to $V_{ss}$.

Figure 3:
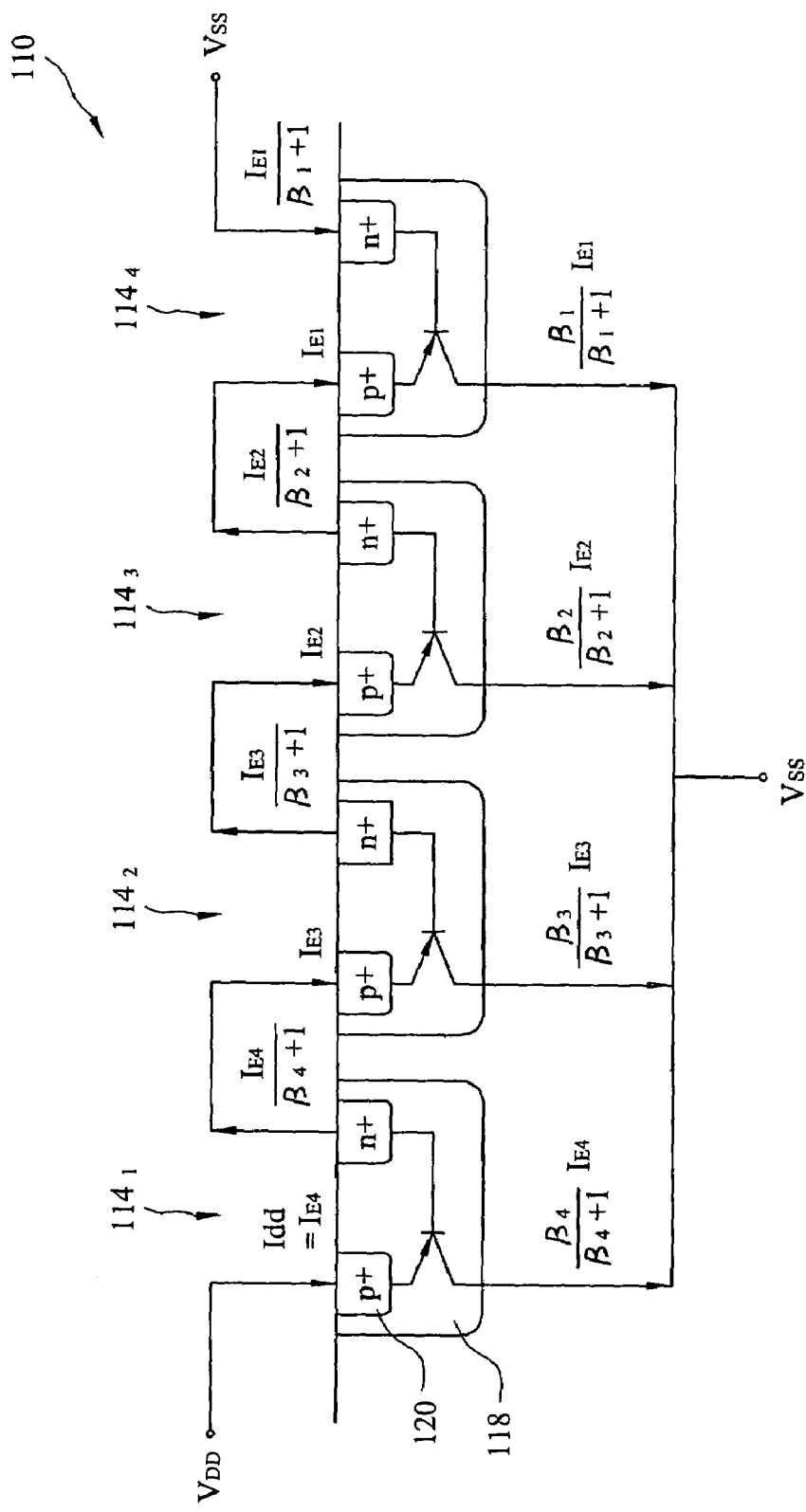
FIG. 3 illustrates current leakage in a four diode string.

FIG. 3 illustrates the current leakage of the diode string 110. The diode string 110 has four diodes $114_1$-$114_4$ and these same subscripts will be used to describe the operation. For simplicity, only vertical bipolar transistors are shown and the current flowing through the diodes is not taken into account since the diodes do not have leakage. Accordingly, all currents shown below relate to bipolar transistors only. It is to be appreciated that this model is only used to explain the effect of the leakage current, not to provide an exact amount of total current. Symbol $I_E$ followed by a diode number is used to represent the emitter current of the vertical bipolar transistor. This current is equal to the current flow into the base region (n-well 118), but since collector current leaks through substrate 116, less current flows out of the n+ region into another diode.

In each of the vertical bipolar transistors shown, if $I_E$ is emitter current, and β is the current gain, then the collector current (leak current) is $I_E*β/(β+1)$, the base current is $I_E*1/(β+1)$. The base current also equals the current that flows into the next diode in the string. Therefore, the leak current $I_s$ is:

$$I_S = I_{E4}*β_4/(β_4+1) + I_{E3}*β_3/(β_3+1) + I_{E2}*β_2/(β_2+1) + I_{E1}*β_1/(β_1+1)$$ [Eq. 1]

At each stage of the diode string 110, a percentage of $β/(β+1)$ of the emitter current leaks to the substrate 116, so that less and less emitter current flows to next diode in the string. This phenomena results in less and less voltage drop for that next diode stage.

diode 1=> diode $114_1$
diode 4=> diode $114_4$

In the ideal case where the bipolar transistor has zero gain, $β_1$ through $β_4$ all equal zero so that the leak current is zero. In this case, the same current flows throughout diode 1 through diode 4, so that all diodes are turned on essentially at same time, thereby resulting in a high turn on voltage. However, in real world situations β is a non zero value. Therefore, when $I_{En}$ is a current, $I_{En}$ flows into the emitter of diode n, a current of only $1/(β+1)I_{En}$ flows into the emitter of the next diode n-1. From this, it is derived that:

$$I_{E4} = I_{E1}*(β_4+1)(β_3+1)(β_2+1)$$ [Eq. 2]

Assume $β_1$ through $β_4$ all equal one, which is relatively small, then $I_{E4}$ is eight times $I_{E1}$. Therefore, more current flows through diode $114_1$ (between p+ region 120 and n-well 118) than through any other diodes. Diode $114_1$ becomes a weak point and is much more likely to be turned on at a relatively low voltage. The situation gets worse if β is higher or more diodes 114 are used in the diode string 110.

Leaked current also causes another effect, which may be significant. Leaked current does not always flow to $V_{ss}$ directly. Depending on the position of $V_{ss}$, leak current may flow to other diodes in the diode string 110. For example, as shown in FIG. 3, since diode $114_3$ is between diode $114_4$ and $V_{ss}$, part of the leak current of diode $114_4$ flows to diode $114_3$. This leak current adds to current $I_{E3}$, causing more current to flow through diode $114_3$. Therefore diode $114_3$ can turn on at a relatively smaller current $I_{dd}$.

The turning on of diode $114_3$ can cause a chain effect to the diode string 110. When a high voltage transient occurs and all diodes are in an "off" state, voltage is distributed among the diodes according to their resistances at the "off" state so that a diode with a higher resistance takes on a greater share of the overall voltage. When diode $114_3$ changes to a conducting state, the voltage drop on diode $114_3$ is relatively small and most of its share of voltage is distributed to the rest of the diodes, making them more likely to be turned on. Therefore, the turned on voltage of the diode string 110 is normally dragged down by the diode that either has lower turn on voltage or higher resistance. In one aspect, the present invention makes an effort to remove this effect and the result has shown that this effect is serious to the turn on voltage of the diode string.

Figure 4:
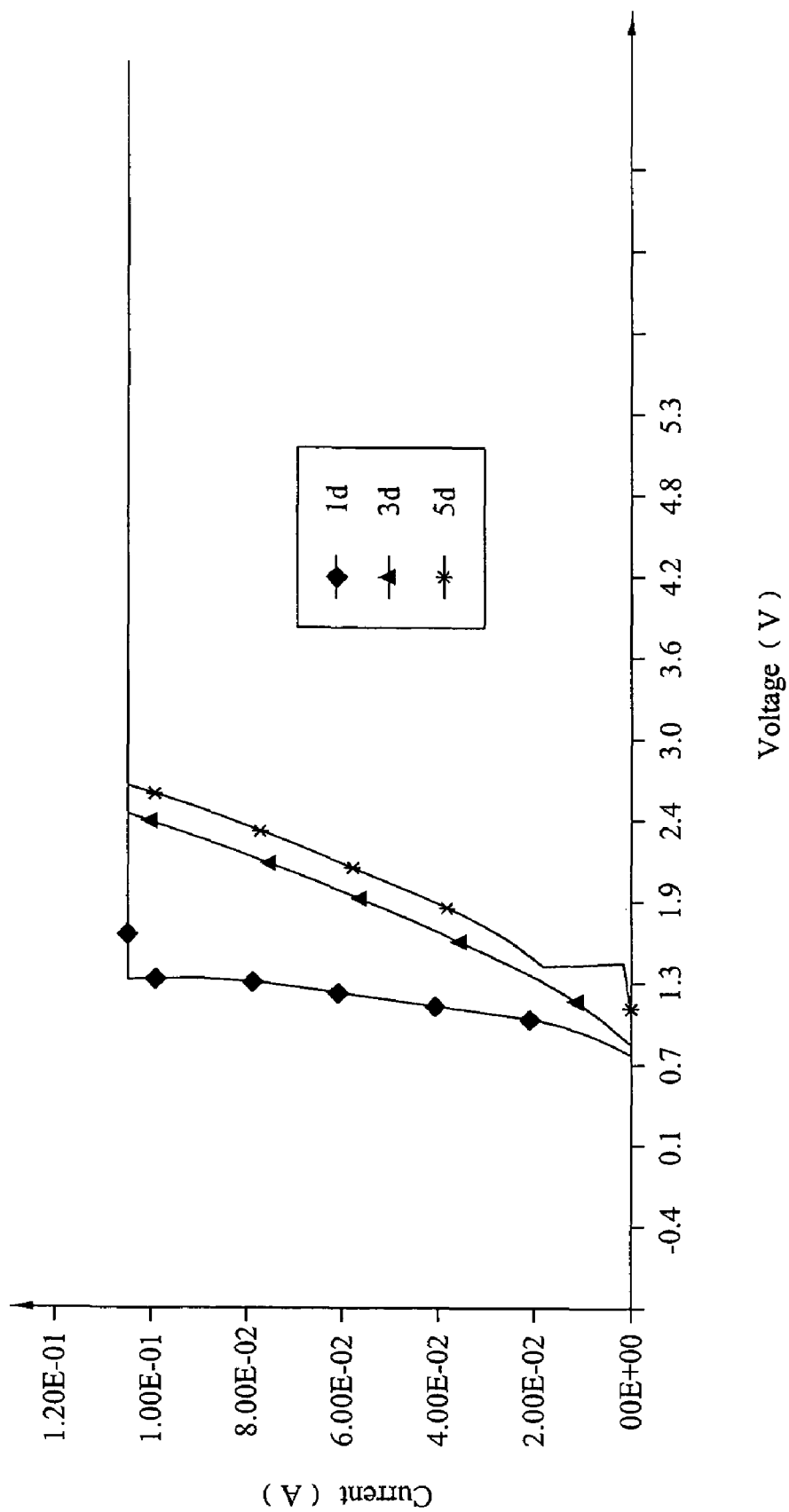
FIG. 4 is the voltage-current characteristics of conventional diode strings.

One goal is for the turn on voltage to be set high enough to satisfy the requirements of circuit design. Another goal is to have the turn on voltage of a diode string be predictable, since circuit designers need to know how many diodes are needed when a turn on voltage is desired. The more linear the turn on voltage is as a function of the number of diodes, the easier it is to predict the number of diodes needed. FIG. 4 shows the voltage-current characteristics of conventional diode strings. Line 1d indicates a single diode current-voltage response. Line 3d shows a 3-diode string current-voltage response, and line 5d shows a 5-diode string current-voltage response.

This chart shows that when the number of diodes increases, the turn on voltage of the diode string increases much less than expected. Table 1 shows the result of several conventional diode strings which have one diode, three diodes, or five diodes. The result is based on 1 uA criteria.

TABLE 1

| Actual number of diodes | 1 | 3 | 5 |
|---|---|---|---|
| Equivalent number of diodes | 1 | 1.12 | 1.94 |

In Table 1, the equivalent number of diodes is the actual turn on voltage of a diode string divided by the threshold voltage of a single diode. In one example, the threshold voltage of one diode is 0.65V. The average equivalent number of diodes calculated from this value is 1.12 for a diode string with three diodes, and the average equivalent number of diodes is 1.94 for a diode string with five diodes.

Table 1 shows that leak current in a conventional diode string causes at least two difficulties: The turn on voltage is low, so it is hard to satisfy some requirements that demand high turn on voltages. Also, the turn on voltage of a diode string is far from linear making it difficult to set the turn on voltage to a desired level by simply choosing the number of diodes. In one aspect, the present invention targets these problems through a novel integrated circuit with guard ring insertions.

An integrated circuit structure providing electrostatic discharge protection is now described. As shown in FIGS. 8 and 10, a diode string is formed on a substrate 2. A guard ring 12 and insertions 14 are formed. The guard ring 12 and insertions 14 are connected to ground potentials or power potentials. The turn on voltage of the diode string is improved. First a description of the formation of a structure of the preferred embodiment will be described using FIGS. 5 through 9.

Figure 5:
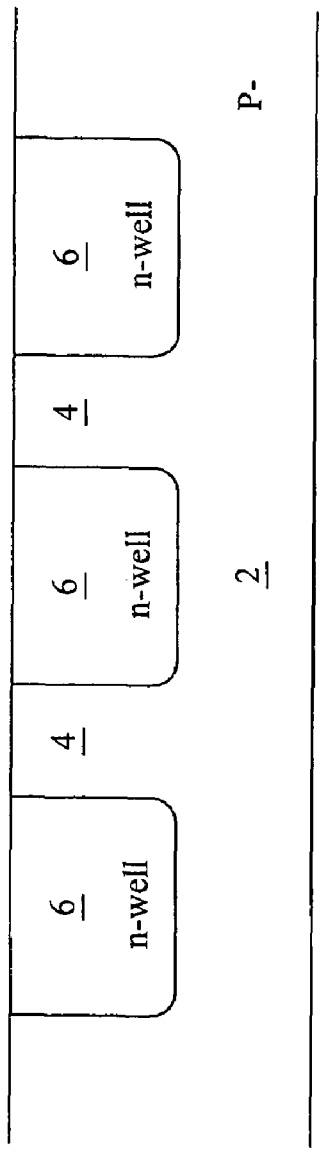
FIGS. 5 through 8 are cross-sectional views of intermediate stages in the manufacture of a diode string in a p-substrate.

FIG. 5 illustrates the formation of n-wells 6. In the preferred embodiment, substrate 2 is a p-type silicon substrate. In various embodiments, silicon substrate 2 may be either a bulk silicon wafer or a layer comprising other semiconductor material such as SiGe or a layer of silicon formed on an insulating layer such as a buried oxide layer (not shown), in the well-known silicon-on-insulator (SOI) structure. Substrate 2 is lightly doped with p-type impurities. It is desirable that boron is used as an impurity, but other impurities such as gallium, and indium may also be used. The concentration of impurity is in a range of about $1\times10^9$ cm$^{-2}$ to about $1\times10^{13}$ cm$^{-2}$, more preferably about, $1\times10^{10}$ cm$^{-2}$.

N-wells 6 are formed in substrate 2 preferably by implantation (or diffusion) of n-type impurities such as antimony, phosphorus and arsenic. The concentration of impurities is preferably about $1\times10^9$ cm$^{-2}$ to about $1\times10^{13}$ cm$^{-2}$, more preferably about, $1\times10^{12}$ cm$^{-2}$. In another embodiment, n-wells 6 may also be formed by epitaxially growing n-type layers on the p-substrate, then implant (or diffuse) p-type impurities into separation regions 4 so these regions are converted to p-type, and remaining regions become n-wells. The spacing between n-wells, also the width of region 4, is preferably between about 0.01 μm to about 5 μm. The n-wells 6 have an area of about 1 μm$^2$ to 10000 μm$^2$, preferably about 200 μm$^2$. Desired depth of the n-wells is about 0.2 μm to about 20 μm, preferably about 2 μm.

Figure 6:
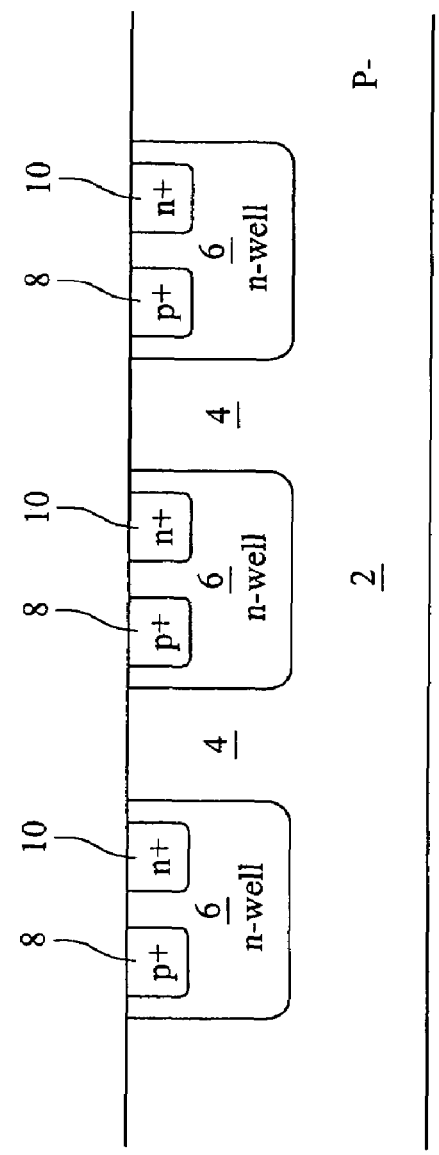

As illustrated in FIG. 6, p+ regions 8, and the anode of the diodes, are formed in the n-wells. Typically, p+ regions 8 are formed by implantation (or diffusion) of p-type impurities (such as boron, gallium and/or indium). The concentration is typically in the range of about $1\times10^{13}$ cm$^{-3}$ to about $1\times10^{18}$ cm$^{-3}$, preferably about $1\times10^{15}$ cm$^{-3}$ as known in the art.

Also shown in FIG. 6, n+ regions 10 are formed in n-wells. Typically, n+ regions 10 are formed by implanting (or diffusing) n-type impurities (such as phosphorus, antimony and/or arsenic). The concentration is typically about $1\times10^{12}$ to about $1\times10^{18}$. The n+ regions 10 are formed in order to lower the Schottky barrier so that a good ohmic contact can be made to well region 6.

Figure 7:
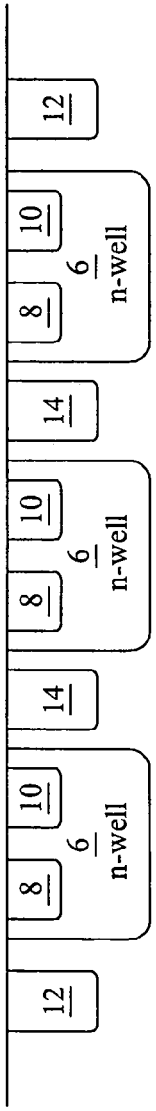
Figure 8:
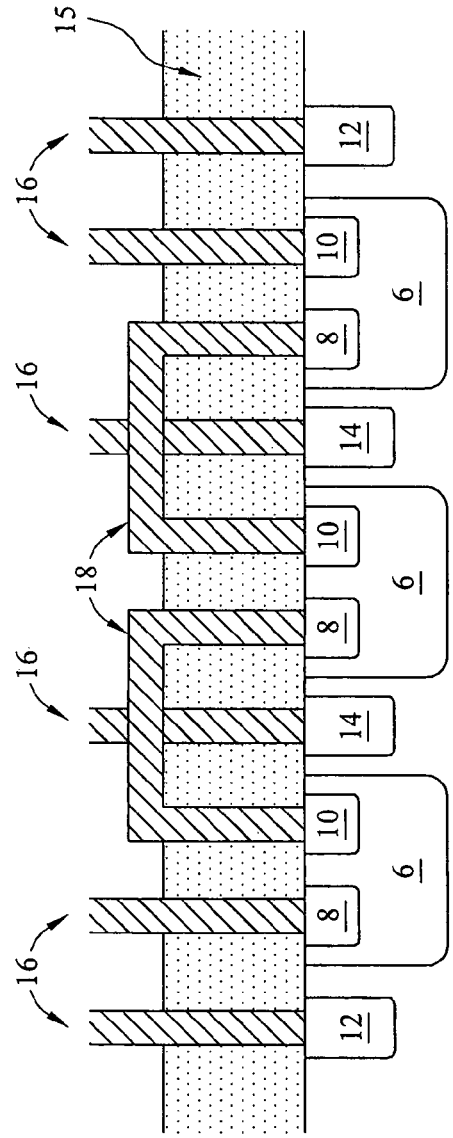

A guard ring 12 and insertions 14 are formed as shown in FIG. 7. In the preferred embodiment, the guard ring 12 is a p+ region formed around the diode string. (A plan view is shown in FIG. 10.) The guard ring 12 is used to collect electrons that may interfere with neighboring circuits and cause latch-up. Insertions are p+ regions formed in separation regions 4. In the preferred embodiment, the guard ring 12 and insertions 14 are formed by implantation (or diffusion) of boron, but other p-type impurities such as gallium or indium may also be used. To effectively lower the Schottky barrier, hence contact resistance between the p+ region 8 and the metal pad, it is desirable that the concentration of the p-type impurity is in the range of about $1\times10^{12}$ to about $1\times10^{18}$, more preferably about $1\times10^{15}$. In an alternate embodiment, the ground ring 12 and insertions 14 are formed in the same doping step as the p+ regions 8. The insertions 14 are desired to be continuous with the guard rings 12 at both ends. FIG. 10 is a top view of the preferred embodiment. In another embodiment, the insertions 14 are continuous with guard ring 12 at only one end. Since guard ring 12 and insertions 14 are all interconnected, they can be coupled to ground potentials at only one point (or more if desired). In yet another embodiment, the insertions 14 are not connected to guard ring 12 at all. In this case, each isolated insertion 14, as well as guard ring 12, should be coupled to a ground potential respectively. In an alternate embodiment, guard ring 12 and insertions 14 are coupled to different reference potentials, and the voltage of the reference potentials may be different.

The guard ring 12 preferably has a depth of about 0.001 μm to about 5 μm, more preferably about 0.05 μm. The width of the guard ring 12 is preferably in the range of about 0.1 μm to about 100 μm, and more preferably about 10 μm. Likewise, for the insertions 14 to sink current effectively, it is desirable that the depth of the insertions 14 is in the range of about 0.001 μm to about 5 μm, more preferably about 0.05 μm. In other embodiments, the depth can be as low as about 0.001 μm. The width of the insertions 14 is preferably less than about 10 μm. The distance between the guard ring 12 or insertions 14 and the neighboring n-wells 6 is preferably less than about 5 μm, more preferably about 0.5 μm.

FIG. 8 is an illustrative view of the formation of metal plugs 16, or pads, and metal lines 18. An inter-level dielectric (ILD) 15, also sometimes known as a pre-metal dielectric (PMD), is deposited over the surface of the devices formed in previous steps. This ILD layer 15 is preferably silicon oxide deposited, e.g., by decompensation of Tetraethyl Orthosilicate (TEOS), chemical vapor deposition, plasma enhanced CVD, low pressure CVD, or other well-known deposition techniques. ILD layer 15 will provide insulation between the devices and overlying metal lines that will be formed subsequently.

Contact openings are then formed through ILD layer 15 to expose p+ regions 8, n+ regions 10, guard ring 12 and insertions 14. Metal plugs 16 are then formed inside the openings. The metal plugs 16 may be formed of tungsten, aluminum, copper, or other well-known alternatives. Metal lines 18 are also formed to connect diodes. The formation of metal plugs and metal lines is well-known in the arts and is not repeated.

Figure 9:
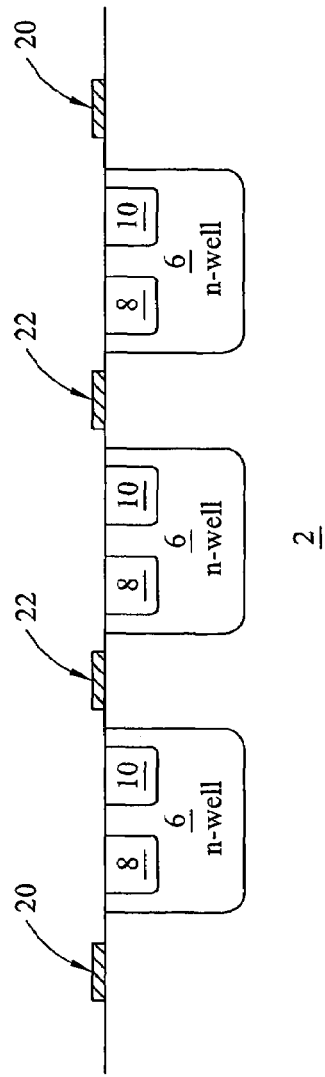
FIG. 9 illustrates a cross-sectional view of another embodiment of the formation of a guard ring and insertions.
Figure 10:
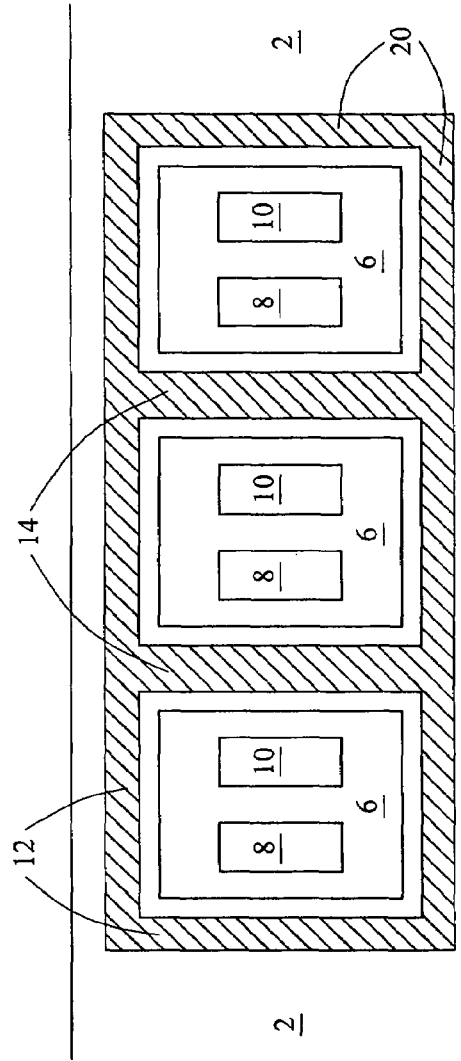
FIG. 10 illustrates a top view of a guard ring and insertions.

FIG. 9 shows another embodiment of the formation of the guard ring and insertions. In this embodiment, there are no p+ regions formed in substrate 22. Instead, conductive lines 20 and 22 (e.g. metal) are formed on substrate 2 where p+ regions 12 and 14 were formed in the preferred embodiment. The conductive lines enclosing the diode string are the guard ring 20, while the conductive lines formed between n-wells are the insertions 22. The conductive lines 20 and 22 may be formed of a metal such as tungsten, aluminum, copper, or other well-known alternatives or alloys. Preferably, the guard ring 20 and insertions 22 have a thickness of about 0.05 μm to about 5 μm, more preferably about 0.8 μm. It is desirable that the metal lines have a thickness of about 0.05 μm to about 5 μm, preferably about 0.8 μm. The distance between any point on the guard ring/insertions and closest diodes is preferably less than about 5 μm, more preferably about 0.5 μm. The top view of this embodiment may also be illustrated in FIG. 10, wherein the guard ring 20 overlaps with region 12, and the insertion 22 overlaps with region 14.

Figure 11:
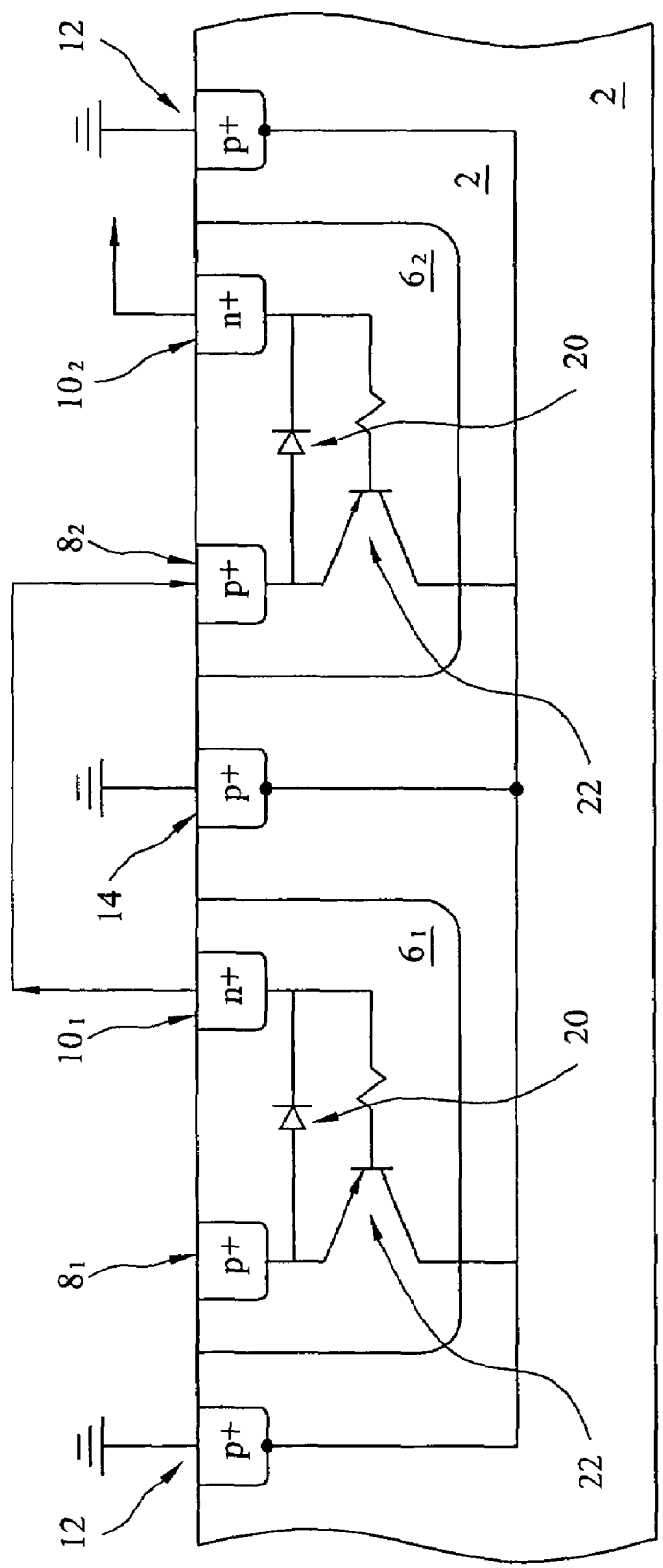
FIG. 11 is a schematic view of the ESD protection circuit in a p-substrate.

FIG. 11 is a schematic view of an ESD protection circuit formed in the steps shown in FIGS. 5 through 8. Diode 20 is formed between p+ region 8 and n-well 6. In addition, a vertical bipolar transistor 22 is formed where p+ region 8 is the emitter, n-well 6 is the base, and p-substrate 2 is the collector. The vertical bipolar transistors are connected to a ground potential through the guard ring 12 and insertion 14. The guard ring 12 and insertion 14 provide current sinks to the nearby diodes. Instead of running through other diodes in order to reach ground, leak current can now be sunk to the nearest guard ring 12 or insertion 14. This greatly reduces interference between diodes caused by leak current, therefore improved turn on voltage of the diode string.

The bias potential at node 12 or 14 can be at any voltage level as long as it is not higher than the diode's voltage level. Because the potential at n+ node 10 ($V_{10\text{-}2}$) is the lowest in the diode string, ground potential may not be higher than the voltage $V_{10\text{-}2}$ at this node. Therefore, the ground potential may be in a range of $V_{ss}$ to $V_{10\text{-}2}$. However, it is preferred that the bias potential at nodes 12 and 14 is equal to $V_{ss}$. The metal plus at node $8_1$ and node $10_2$ forms the input and output pad of the diode string.

In an alternate embodiment, the present invention can be implemented in an n-substrate. The method of forming diodes in an n-substrate is essentially the same as forming diodes in a p-substrate with the type of materials reversed. As such, these steps will not be repeated. FIG. 8, which is used to illustrate the cross-sectional view of an ESD circuit in a p-substrate can also be used to illustrate the cross-sectional view of the circuit in an n-substrate. In that case, substrate 2 is an n-type substrate and regions 6 are p-wells, which are the same as the anodes of the diodes. Regions 8 are n+ regions, which also form the cathodes of the diodes and p+ regions 10 are heavily doped in order to form ohmic contact. As before, guard ring 12 is formed around diode string. Insertions 14 are formed in regions 4. In the preferred embodiment, the guard ring 12 and insertions 14 are formed in the substrate by implanting n-type impurities. The specification for forming previous mentioned regions is similar to what is specified for circuit formation in a p-substrate. In another embodiment, the guard ring and insertion can also be formed as metal lines in direct contact with the substrate and the formation of such is essentially the same as the embodiment in the p-substrate. The ILD layer 15, metal plugs 16 and metal lines 18 are then formed.

Figure 12:
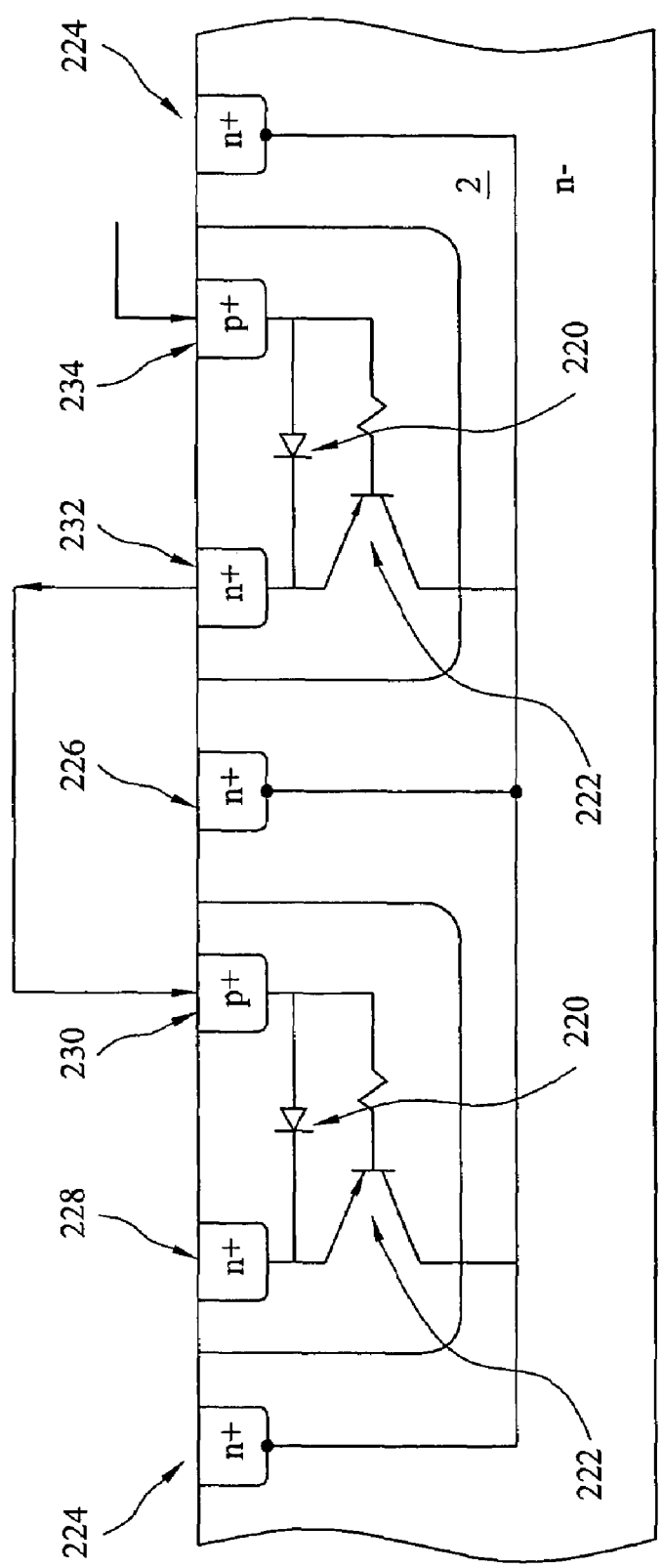
FIG. 12 is a schematic view of the ESD protection circuit in an n-substrate.

FIG. 12 is a schematic view of the diodes and vertical bipolar transistors in an n-substrate. Diode 220 is between n+ region 232 and p-well 222. Vertical bipolar transistor 222 is an npn transistor where n+ region 232 is the emitter, p-well 222 is the base, and n-substrate 2 is the collector. The connectors of the vertical bipolar transistors are connected to a power potential through the guard ring 224 and insertions 226. The guard ring and insertions provide current sinks to nearby diodes. The leak current can now be drawn from the nearest guard ring or insertions and much less leak current comes from other diodes. This greatly reduces interference between diodes caused by leak current, therefore improves the turn on voltage of the diode string. The power potential at node 224 or 226 can be at any voltage level as long as it is not lower than the voltage level at diode nodes. Because the potential at p+ node 234 ($V_{234}$) is the highest in the diode string, power potential cannot be lower than $V_{234}$. Although power potential may be in a range of $V_{234}$ to $V_{dd}$, it is desirable that the power potentials connected to nodes 224 and 226 are higher than both $V_{dd}$ and $V_{234}$. In the embodiments that the guard ring and insertions are not interconnected, the guard ring and insertions may be connected to different power potentials as long as the power potentials are between $V_{234}$ and $V_{dd}$.

Figure 13:
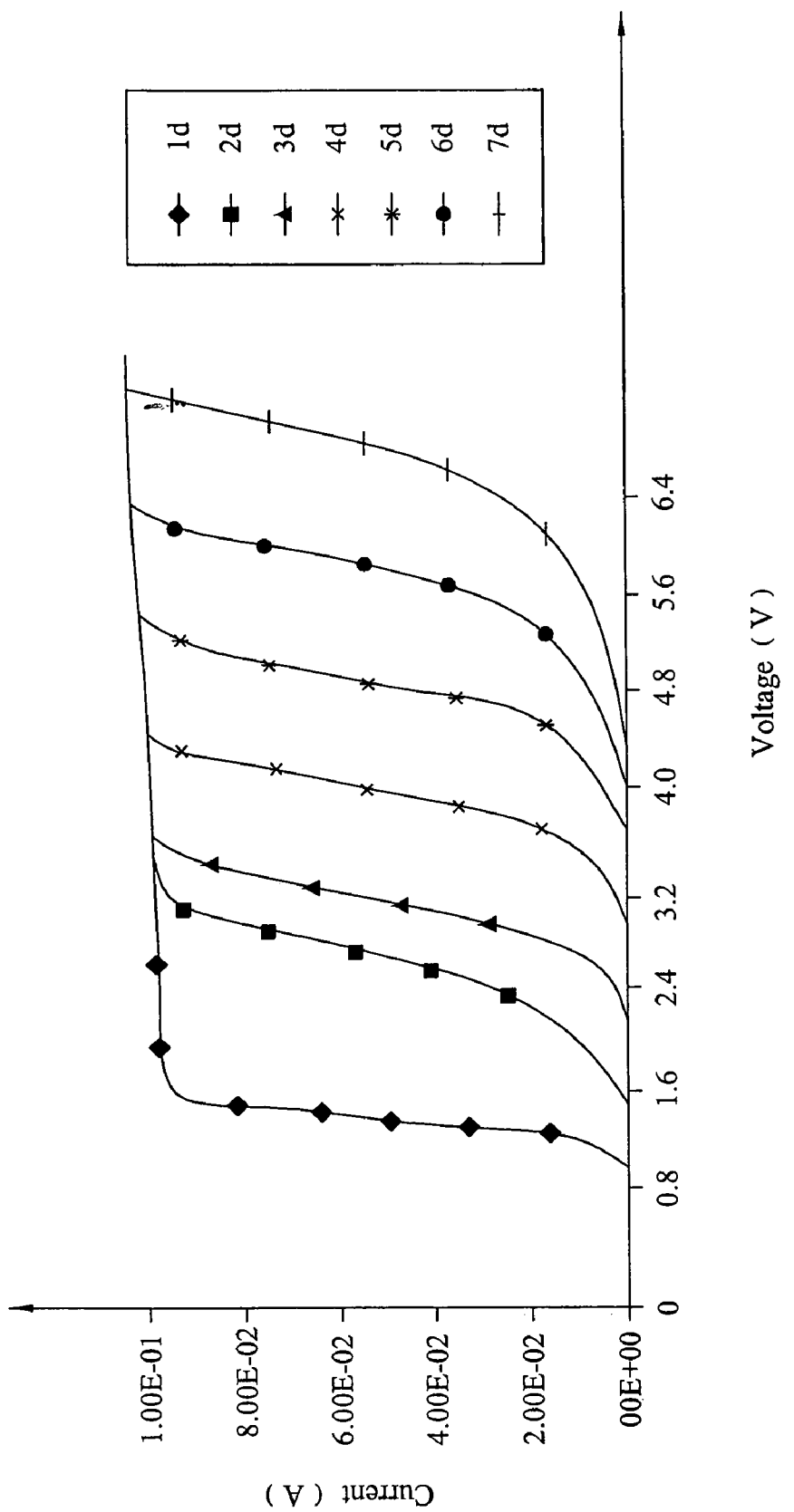
FIG. 13 illustrates the voltage-current characteristics of diode strings made by the present invention.

FIG. 13 illustrates the voltage-current characteristics of diode strings made by the present invention, wherein a number followed by a "D" indicates the number of diodes in the diode string. Comparing FIG. 4 and FIG. 13, it is found that the turn on voltage of the diode string has greatly improved. Table 2 shows the equivalent number of diodes calculated from the turn on voltage of the diode strings based on 1 uA criteria:

TABLE 2

| Actual number of diodes | 1 | 2 | 3 | 4 | 5 | 6 | 7 |
|---|---|---|---|---|---|---|---|
| Equivalent number of diodes | 1 | 1.86 | 2.57 | 3.29 | 4 | 4.71 | 5.29 |

It is noticed that the turn on voltage of the diode strings are closer to the total of the threshold voltage of the diodes. It is also noticed that the turn on voltage is more linear as to the number of diodes in the diode string. When the number of diodes in the diode string is less than 5:

$$(n-1)*V_d < V_t < n*V_d \quad [\text{Eq. 3}]$$

where n is the number of diodes in the string, $V_d$ is the threshold voltage of a single diode, and $V_t$ is the turn on voltage of the diode string. When the number of diodes further increases to 5 and above, the number of equivalent diodes increases less.

The turn on voltage of the diode string shown in FIG. 13 is still lower than the total of all threshold voltages. For one reason, all diodes are not completely the same even if they are built in the same substrate. The threshold voltages and the resistances are different from diode to diode. As explained previously, very likely, the diode that has the lowest threshold voltage and the highest resistance determines when the entire diode string is turned on. While the effect is reduced, the leakage is not removed.

Figure 14:
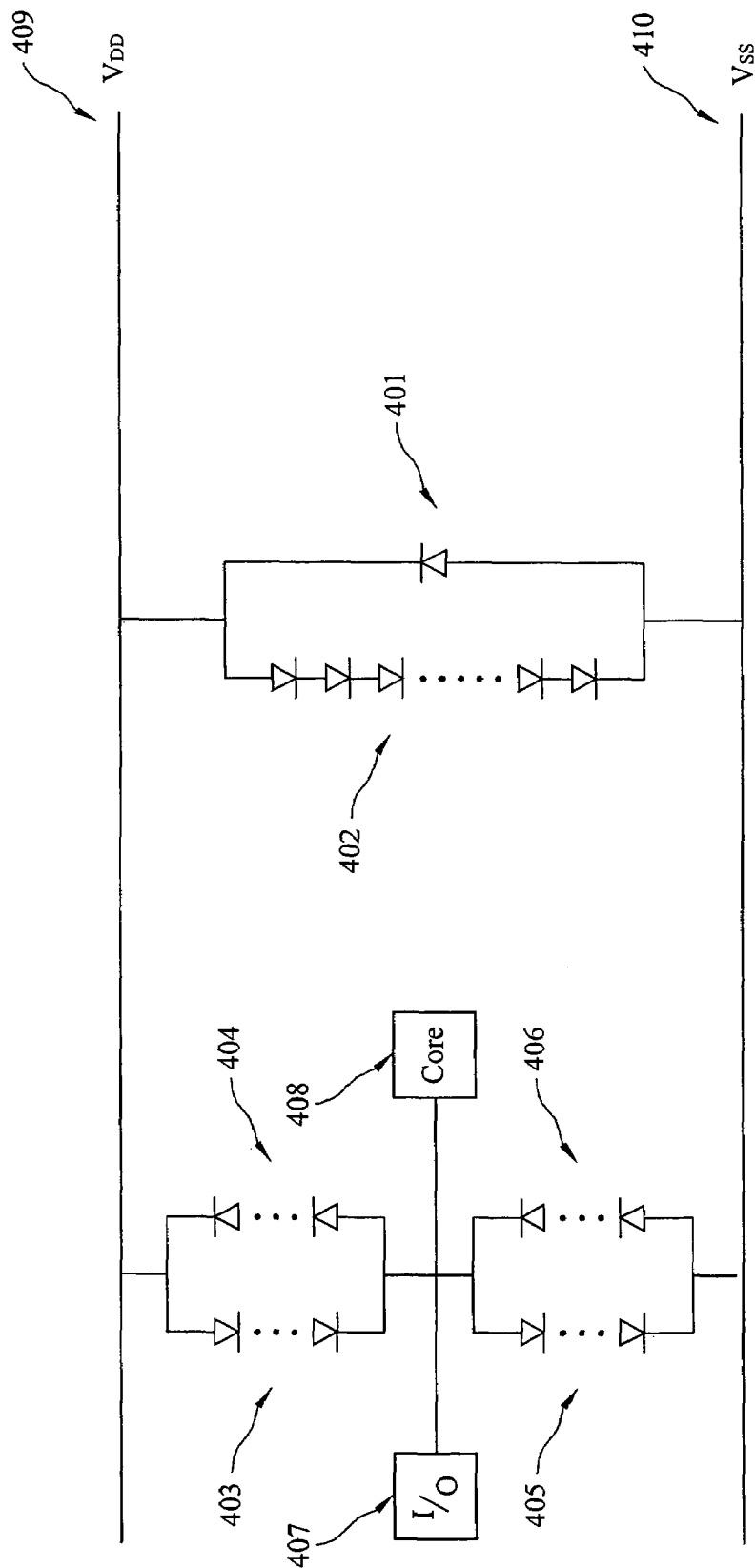
FIG. 14 is a schematic view of the present invention being used in whole chip design.

FIG. 14 shows one embodiment of the present invention being integrated into an integrated circuit (IC) chip design. This IC can be a logic device, such as a processor (e.g., microprocessor or digital signal processor) or a memory cup (e.g. DRAM, SRAM Flash) or other. Diodes 402 make up a diode string between $V_{dd}$ and $V_{ss}$. If the voltage transient between $V_{dd}$ and $V_{ss}$ is higher than the turn on voltage of diode string 402, the diode string 402 changes to a conducting state and the voltage difference between $V_{dd}$ and $V_{ss}$ is brought down. Diode 401 is used to protect against negative voltage transients. Since $V_{ss}$ does not need to be held at a level above $V_{dd}$, one diode is typically enough even though more can be used.

Diode strings 403, 404, 405 and 406 are designed to protect the core circuit from voltage transients that may occur at I/O 407, $V_{dd}$ or $V_{ss}$. While the node 407 is referred to as an input/output node, it is understood that for the purposes of this invention, an I/O also relates to input only nodes and output only nodes. The four-way protection makes sure that none of the I/O, $V_{dd}$ and $V_{ss}$ goes too high or too low. If any of the I/O 407, $V_{dd}$ or $V_{ss}$ has a voltage transient, there is at least one diode string that will be turned on to protect the circuit and also help to bring back the voltage. By carefully controlling the turn on voltage of the diode strings in the circuit design, the range that the I/O voltage is allowed to fluctuate is defined. Using $V_t$ to represent the turn on voltage of the diode strings, the following equations can be derived:

$$V_{I/O} > V_{dd} - V_{t403} \quad [\text{Eq. 4}]$$

$$V_{I/O} < V_{dd} + V_{t404} \quad [\text{Eq. 5}]$$

$$V_{I/O} > V_{ss} - V_{t406} \quad [\text{Eq. 6}]$$

$$V_{I/O} < V_{ss} + V_{t405} \quad [\text{Eq. 7}]$$

Therefore, $V_{I/O}$ is kept in a range wherein the high end of the range is defined by ($V_{dd}+V_{t404}$) or ($V_{ss}+V_{t405}$), whichever is smaller. The low end of the range is defined by ($V_{dd}-V_{t403}$) or ($V_{ss}-V_{t406}$), whichever is bigger.

Figure 15:
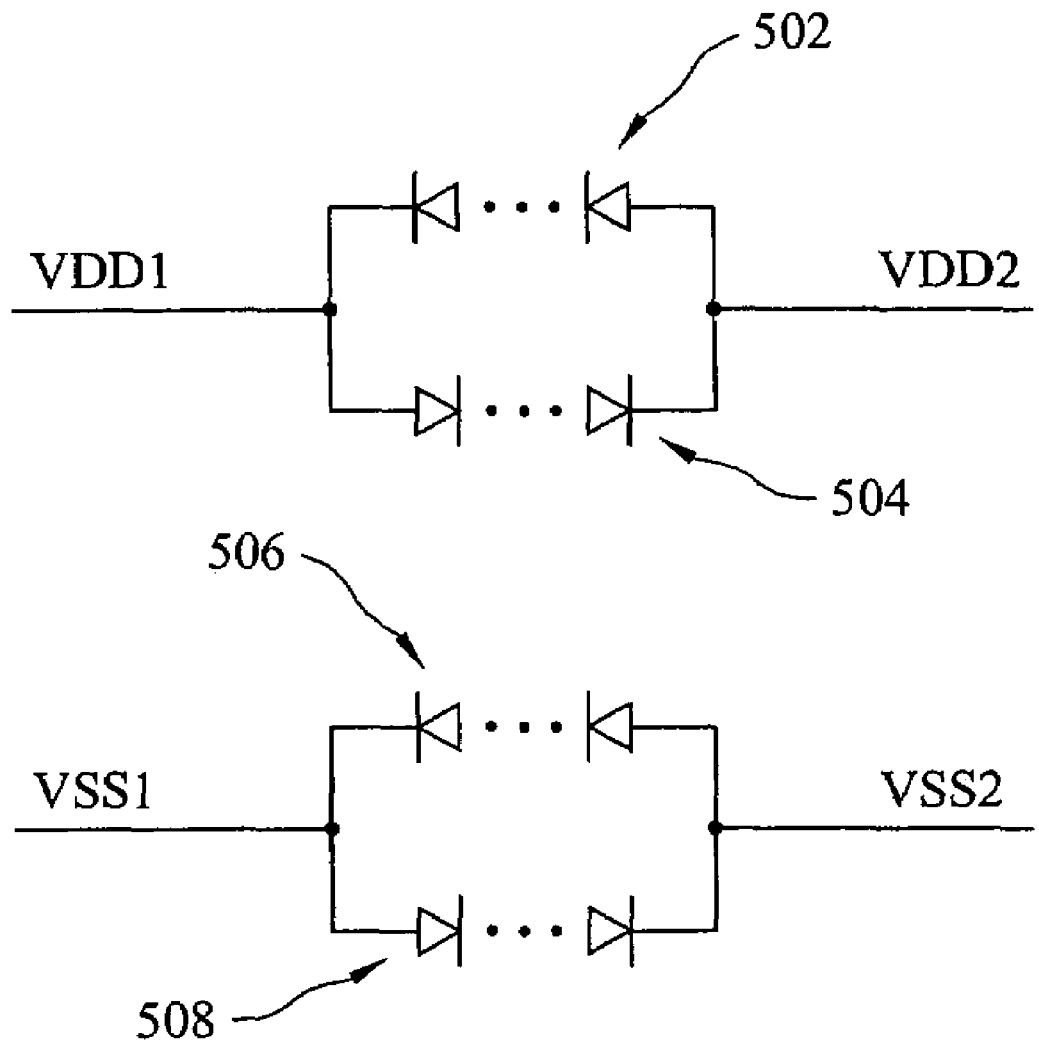
FIG. 15 is a schematic view of the present invention being used for power separation.

FIG. 15 illustrates a power separation scheme using aspects of the present invention. In an integrated circuit, ESD may occur between either of the two nodes. Therefore, ESD protection circuits may be used between either of the two nodes. Diode strings 502, 504, 506 and 508 are interconnected between power potential $V_{dd1}$, $V_{dd2}$, $V_{ss1}$, and $V_{ss2}$. If an electrostatic discharge causes a positive voltage transient between $V_{dd2}$ and $V_{dd1}$, diode string 502 is turned on and discharges. Likewise, if an electrostatic discharge causes a negative voltage transient between $V_{dd2}$ and $V_{dd1}$, diode string 504 is turned on and discharges. Also, diode strings 506 and 508 are used to protect the circuit from positive and negative transient between $V_{ss2}$ and $V_{ss1}$, respectively. Diode strings used to protect the circuit between $V_{dd}$ and corresponding $V_{ss}$ are not shown as they have been explained in FIG. 14.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor integrated circuit structure comprising:
   a semiconductor region of a first conductivity type;
   a first well region formed in the semiconductor region, the first well region being lightly doped to a second conductivity type opposite the first conductivity type;
   a first highly doped n-region formed in the first well region;
   a first highly doped p-region formed in the first well region and spaced apart from the first n-region;
   a second well region formed in the semiconductor region, the second well region being lightly doped to the second conductivity type;
   a second highly doped n-region formed in the second well region;
   a second highly doped p-region formed in the second well region and spaced apart from the second n-region;
   a first insertion region disposed in the semiconductor region between the first well region and the second well region, the first insertion region being heavily doped to the first conductivity type;
   a third well region formed in the semiconductor region, the third well region being lightly doped to the second conductivity type;
   a third highly doped n-region formed in the third well region;
   a third highly doped p-region formed in the third well region and spaced apart from the third n-region, wherein the first n-region, the first p-region, the second n-region, the second p-region, the third n-region and the third p-region are connected in series to form diodes;
   a second insertion region disposed in the semiconductor region between the second well region and the third well region, the second insertion region being heavily doped to the first conductivity type; and
   a guard ring region disposed in the semiconductor region and encircling the first well region, the second well region, and the third well region, the guard ring region being heavily doped to the first conductivity type, wherein the first and the second insertion regions are physically connected to the guard ring region, and wherein depths of the first and the second insertion regions and the guard ring region are less than depths of the first, the second and the third well regions, and wherein no well region is between any of the first and the second insertion regions and the semiconductor region.

2. The structure of claim 1 wherein the first insertion region, the second insertion region and the guard ring region are all coupled to a ground potential.

3. The structure of claim 1 wherein the first insertion region, the second insertion region and the guard ring region comprise a single continuous doped structure.

4. The structure of claim 1 wherein the first conductivity type comprises p-type.

5. The structure of claim 1 wherein the first insertion region has a width less than about 10 μm.

6. The structure of claim 1 wherein the first well region and the first insertion region have a spacing of less than about 5 μm.

7. The structure of claim 1 wherein the first n-region is electrically coupled to the second p-region and wherein the second n-region is electrically coupled to the third p-region.

8. The structure of claim 7 wherein the first p-region is electrically coupled to a first node and the third n-region is electrically coupled to a second node such that the structure comprises a diode string that serves to lessen excessive voltage differences between the first node and the second node.

9. The structure of claim 8 wherein the first node is a positive power supply node and the second node is a ground node.

10. The structure of claim 8 wherein the second node is a positive power supply node and the first node is a ground node.

11. The structure of claim 8 wherein the first node is an input or output node and the second node is a reference voltage node.

12. The structure of claim 8 wherein the first node is a reference voltage node and the second node is an input or output node.

13. The structure of claim 8 wherein the first node is a first Vss node and the second node is a second Vss node.

14. The structure of claim 8 wherein the first node is a first Vdd node and the second node is a second Vdd node.

* * * * *